United States Patent [19]

Avanzino et al.

[11] Patent Number: 5,705,430
[45] Date of Patent: Jan. 6, 1998

[54] DUAL DAMASCENE WITH A SACRIFICIAL VIA FILL

[75] Inventors: Steven Avanzino, Cupertino; Subhash Gupta, San Jose; Rich Klein, Mountain View; Scott D. Luning, Menlo Park; Ming-Ren Lin, Cupertino, all of Calif.

[73] Assignee: Advanced Micro Devices, Inc., Sunnyvale, Calif.

[21] Appl. No.: 486,777

[22] Filed: Jun. 7, 1995

[51] Int. Cl.$^6$ .................................................. H01L 21/44
[52] U.S. Cl. ..................... 437/195; 437/228; 437/235; 437/238; 437/927
[58] Field of Search ........................... 437/195, 235, 437/238, 927, 228

[56] References Cited

U.S. PATENT DOCUMENTS

| | | | |
|---|---|---|---|
| 4,997,790 | 3/1991 | Woo et al. | 437/195 |
| 5,026,666 | 6/1991 | Hills et al. | 437/195 |
| 5,093,279 | 3/1992 | Andreshak et al. | 437/173 |
| 5,158,910 | 10/1992 | Cooper et al. | 437/195 |
| 5,187,121 | 2/1993 | Cote et al. | 437/195 |
| 5,262,354 | 11/1993 | Cote et al. | 437/195 |
| 5,324,683 | 6/1994 | Fitch et al. | 437/65 |
| 5,328,868 | 7/1994 | Conti et al. | 437/203 |
| 5,371,047 | 12/1994 | Greco et al. | 437/238 |
| 5,461,004 | 10/1995 | Kim | 437/195 |
| 5,466,639 | 11/1995 | Ireland | 437/195 |

*Primary Examiner*—Kathryn L. Gorgos
*Assistant Examiner*—Chrisman D. Carroll
*Attorney, Agent, or Firm*—Foley & Lardner

[57] ABSTRACT

A dual damascene method of fabricating an interconnection level of conductive lines and connecting vias separated by insulation for integrated circuits and substrate carriers for semiconductor devices using a sacrificial via fill. A first layer of insulating material is formed with via openings. The openings are filled with a sacrificial removable material. A second layer of insulating material is deposed on the first layer. In one embodiment, the etch selectivity to the etchant of the second layer is essentially the same as the sacrificial via fill and, preferably, is substantially higher than second layer. Using a conductive line pattern aligned with the via openings, conductive line openings are etched in the second insulating layer and, during etching, the sacrificial fill is removed from the via openings. In a second embodiment, the sacrificial material is not etchable by the etchant for forming the conductive line openings and, after formation of the conductive line openings, the sacrificial material is removed with an etchant to which the first insulating layer is resistive or less selective. A conductive material now is deposited in the conductive line and via openings.

16 Claims, 3 Drawing Sheets

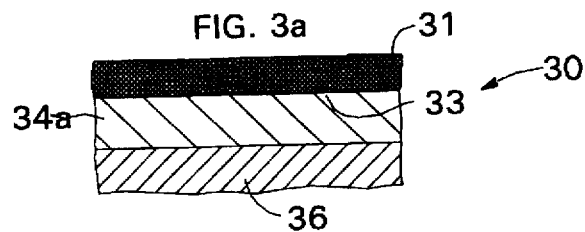
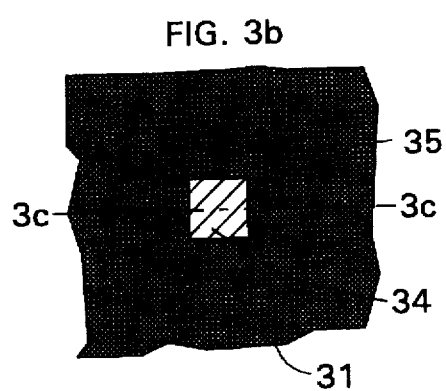
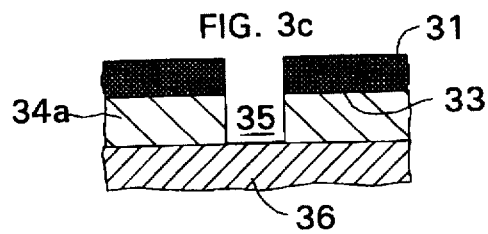
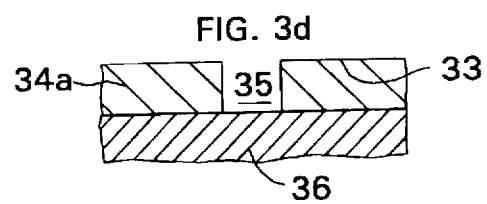
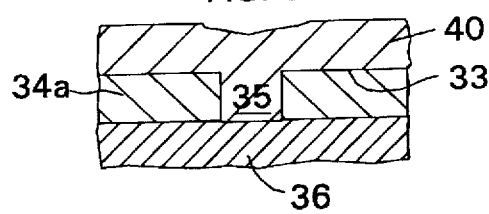
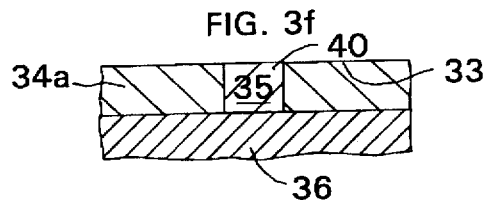
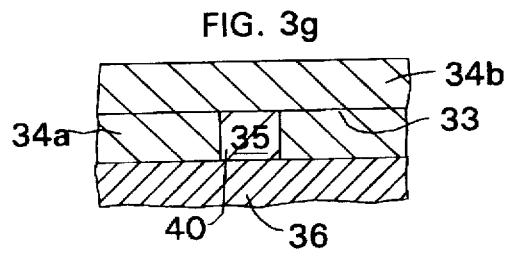
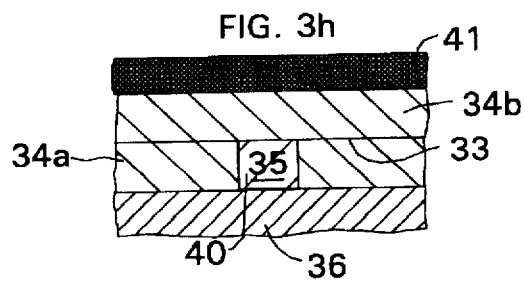
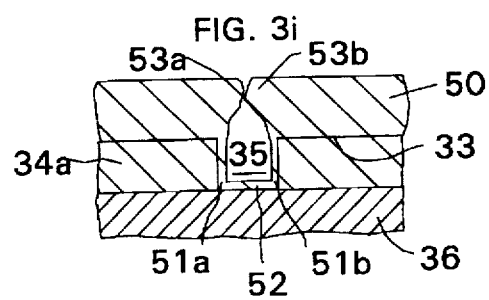
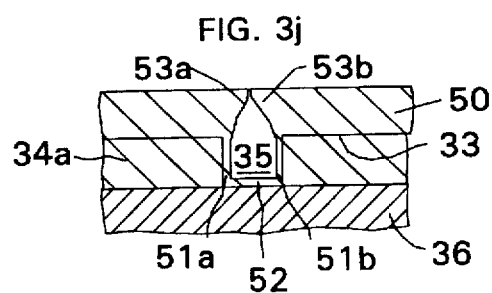
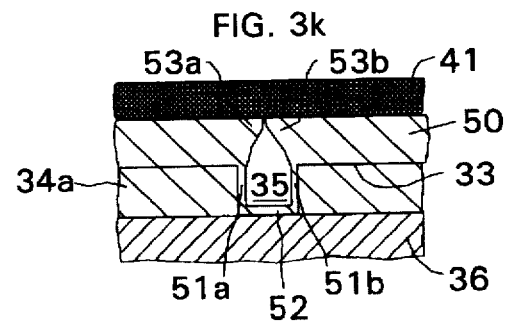

DUAL DAMASCENE WITH A SACRIFICIAL VIA FILL

CROSS REFERENCES TO RELATED APPLICATIONS

This application is related to U.S. patent application Ser. No. 08/478,321, entitled Subtractive Dual Damascene filed on an even date herewith; U.S. patent application Ser. No. 08/478,324, entitled Dual Damascene With a Protective Mask for Via Etching, also filed on an even date herewith; and U.S. patent application Ser. No. 08/478,319, entitled Self Aligned Via Dual Damascene, also filed on an even date herewith, now U.S. Pat. No. 5,619,765.

BACKGROUND OF THE INVENTION

The present invention generally relates to the fabrication of metal conductive lines and vias that provide the interconnection of integrated circuits in semiconductor devices and/or the interconnection in a multilayer substrate on which semiconductor device(s) are mounted and, more particularly, to the fabrication of conductive lines and vias by a process known as damascene.

In very and ultra large scale integration (VLSI and ULSI) circuits, an insulating or dielectric material, such as silicon oxide, of the semiconductor device in the dual damascene process is patterned with several thousand openings for the conductive lines and vias which are filled with metal, such as aluminum, and serve to interconnect the active and/or passive elements of the integrated circuit. The dual damascene process also is used for forming the multilevel signal lines of metal, such as copper, in the insulating layers, such as polyimide, of multilayer substrate on which semiconductor devices are mounted.

Damascene is an interconnection fabrication process in which grooves are formed in an insulating layer and filled with metal to form the conductive lines. Dual damascene is a multi-level interconnection process in which, in addition to forming the grooves of single damascene, the conductive via openings also are formed. In the standard dual damascene process, the insulating layer is coated with a resist material which is exposed to a first mask with the image pattern of the via openings and the pattern is anisotropic etched in the upper half of the insulating layer. After removal of the patterned resist material, the insulating layer is coated with a resist material which is exposed to a second mask with the image pattern of the conductive lines in alignment with the via openings. In anisotropically etching the openings for the conductive lines in the upper half of the insulating material, the via openings already present in the upper half are simultaneously etched in the lower half of the insulating material. After the etching is complete, both the vias and grooves are filled metal. Dual damascene is an improvement over single damascene because it permits the filling of both the conductive grooves and vias with metal at the same time, thereby eliminating process steps. Although this standard damascene offers advantages over other processes for forming interconnections, it has a number of disadvantages, such as the edges of the via openings in the lower half of the insulating layer are poorly defined because of the two etchings and the via edges being unprotected during the second etching. Thus, improvements are needed in the standard damascene process to eliminate the poor edge definition of the via openings.

SUMMARY OF THE INVENTION

The primary object of the present invention is to provide an improved dual damascene process for forming the conductive lines and conducive vias with two etchings but with sharply defined edges on the via opening.

In accordance with the present invention for fabricating an interconnection level, an insulating layer of a thickness of the desired height of a via or a first layer is formed with the via which is filled with an easily removable sacrificial material. After filling, a second insulating layer of a thickness of the desired height of a conductive line is deposited adjacent the first layer. The conductive line opening, aligned with the sacrificially filled via opening, is formed in the second insulating layer and, during its formation, preferably by anisotropically etching, the sacrificial material in the via opening is removed at substantially the same time. The etchant's selectivity is greater for the sacrificial material than the second insulating layer. If desired, a thin etch barrier layer may be deposited between the first and second insulating layers and this layer is removed at via opening at the time via opening is formed. Alternatively, the sacrificial material is not etchable by the etchant for forming the conductive line opening and it is removed, after the formation of conductive line opening, preferably by an etchant which does not etch the insulating layer or, at least, its selectivity is greater for the sacrificial material than the first insulating layer. A more precisely defined via opening with sharply defined edges is obtained in this manner. After the conductive line opening is formed and the sacrificial material removed, both the conductive line and via openings are filled with a conductive material to connect to another interconnection level or elements of an integrated circuit semiconductor device.

BRIEF DESCRIPTION OF THE DRAWINGS

The foregoing and other objects, aspects and advantages will be better understood from the following detailed description of the preferred and other embodiments of the present invention with reference to the drawings, in which:

FIG. 1b (Prior Art) is a cross-sectional view of the patterned resist and etched insulating layer of FIG. 1a taken across 1b—1b of FIG. 1a.

FIG. 2b (Prior Art) is a cross-sectional view of the patterned resist and etched insulating layer of FIG. 2a taken across 2b—2b of FIG. 2a.

FIG. 3a is a cross-sectional view of a portion of interconnection structure of first layer of insulating material coated with a resist layer of the present invention.

FIG. 3b is a plan view of a portion of an exposed and developed via resist pattern on the insulating layer of FIG. 3a.

FIG. 3c is a cross-sectional view of the resist pattern and etched insulating layer taken across 3c—3c of FIG. 3b.

FIG. 3d is a cross-sectional view of the etched insulating layer with the resist removed.

FIG. 3e is a cross-sectional view of the etched insulating layer of FIG. 3c with the resist removed and a conformal etch barrier layer on the upper surface of the insulating layer and on the walls and bottom of the opening in the insulating layer.

FIGS. 3e, 3f, 3g, 3h, 3m and 3n are cross-sectional views of sequential steps of one embodiment of the present invention

FIG. 3i, 3j, 3k, 3o and 3p are cross-sectional views of sequential steps of another embodiment of the present invention

DETAILED DESCRIPTION OF THE PREFERRED EMBODIMENTS OF THE INVENTION

Figure 1A:
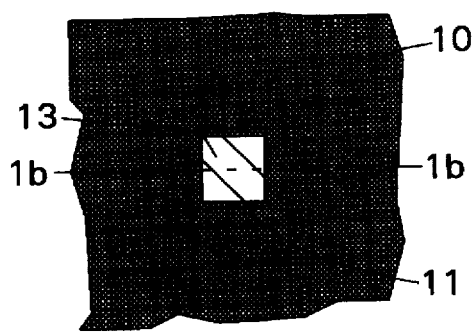
FIG. 1a (Prior Art) is a plan view of a portion of an exposed and developed via resist pattern on an etched insulating layer used in the standard dual damascene process.
Figure 1B:
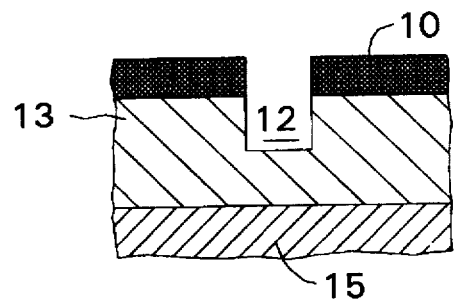
Figure 2A:
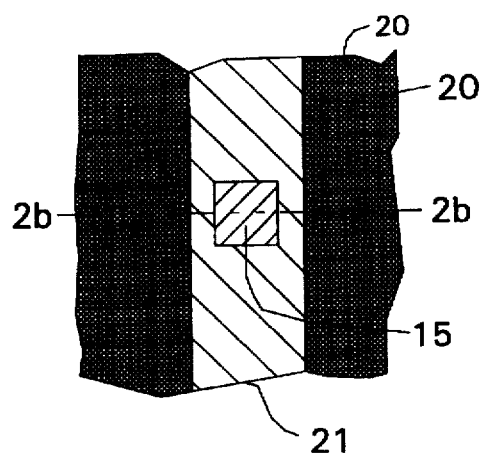
FIG. 2a (Prior Art) is a plan view of a portion of an exposed and developed conductive line resist pattern on the etched insulating layer used in the standard dual damascene process.
Figure 2B:
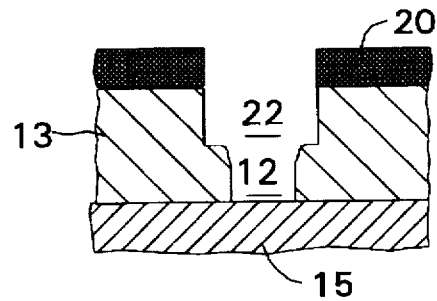
Figure 2C:
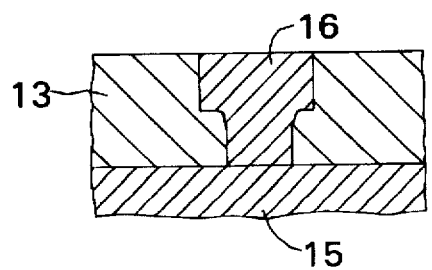
FIG. 2c (Prior Art) is a cross-sectional view of the opening in the insulating layer filled with metal.

Referring now to the drawings and, more particularly to FIGS 1a and 1b and FIGS. 2a, 2b and 2c, there is illustrated the standard method for forming dual damascene openings for conductive lines and vias. FIG. 1a shows a portion of a positive resist 10 with one via pattern opening 11 which is used to define a via opening 12 in an insulating layer 13 for etching the via opening in the insulating layer. As shown in FIG. 1b, the via opening 12 is etched in the upper portion of the insulating layer corresponding to pattern opening 11. The insulating layer 13 is disposed on a completed metallized insulating layer (not shown) containing a conductive line 15 to be physically contacted and electrically connected to an upper conductive line and via, when formed. After the via opening 12 is formed, a resist layer 20 containing a conductive line pattern 21, as shown in FIG. 2a, is aligned with the via opening 12. The conductive line pattern 21, which wider than the via opening 12, is anisotropically etched in the upper portion of the insulating layer to form the conductive opening 22. Simultaneously with this etching, the via opening 12, which is exposed to the same etchant gas(es), is etched (and replicated) in the lower portion of insulating layer 13 to the underlying conductive line 15 which serves as an etch stop. Next, the openings 12, 22 for the conductive line and conductive via, respectively, are filled with metal 16 to make physical contact with and electrical connection to the conductive line 15 as shown in FIG. 2c.

Although the standard dual damascene method provides advantages over other metallization methods, the two etching steps of vias causes the corners of the vias to become ragged because the type of insulating material to be etched is the same for both the via opening and the conductive line opening.

Figure 3L:
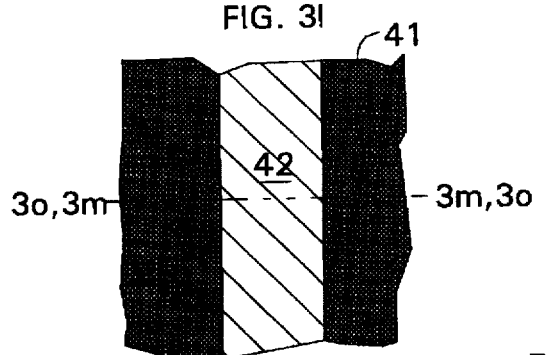
FIG. 3l is a plan view and part of the sequential steps of this embodiment.
Figure 3M:
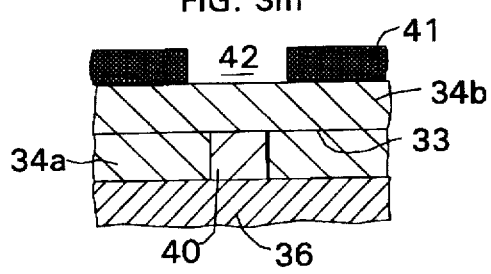
Figure 3O:
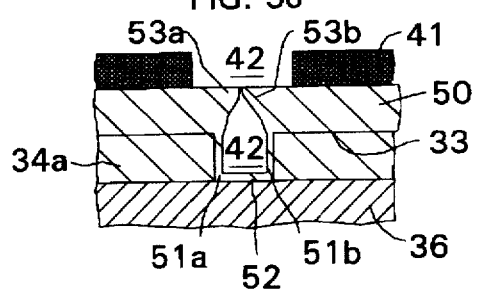
Figure 3N:
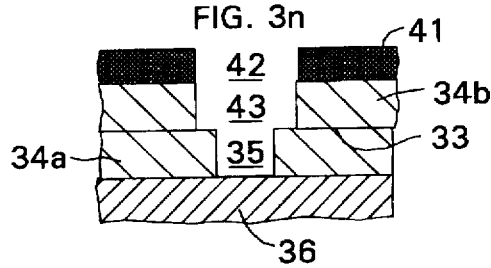
Figure 3P:
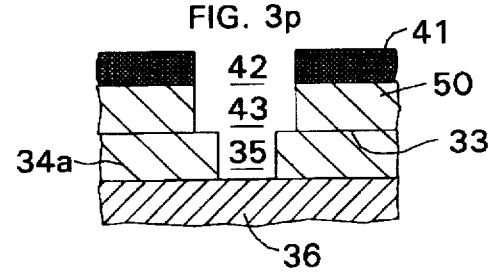
Figure 3Q:
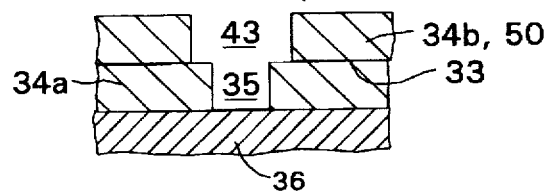
FIGS. 3q, 3r and 3s are cross-sectional views of the final three steps of both the FIGS. 3e et seq. embodiment and the FIGS. 3i et seq. embodiment.
Figure 3R:
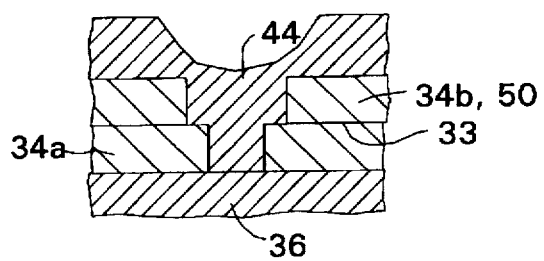
Figure 3S:
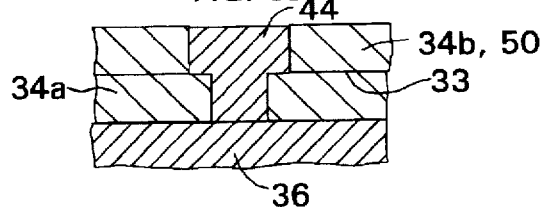

These disadvantages are overcome by the method of the present invention as shown in FIGS. 3a through 3s. As illustrated in these FIGS., a portion of an interconnection structure 30 is shown with a layer 31 of commercially available resist. The resist layer 31 is coated on the surface 33 of a first layer 34a of insulating material, which is herein silicon dioxide ($SiO_2$) with a thickness of herein about 0.8 to 1.0 microns. Other usable insulating materials are silicon nitride ($Si_3N_4$), (SiN); siliconoxynitride ($SiO_xN_y$); and fluonated silicon oxide ($SiO_xF_y$). The resist is a positive resist and the undeveloped resist 31 serves as an etch mask for etching a via opening 35 (FIGS. 3b and 3c) in the uncovered surface 33 of the insulating layer 34a. The via opening and a subsequent conductive line opening, when filled with a conductive material, will provide an interconnection to a conductive line 36 in an underlying insulating layer (not shown) or to an element of an active or passive device in an integrated circuit semiconductor device (not shown). As illustrated in FIG. 3c, the insulating layer at the uncovered surface 33 is anisotropically etched with a plasma gas(es), herein carbon tetrafloride ($CF_4$) containing fluorine ions, in a commercially available etcher, such as a parallel plate reactive ion etch (RIE) apparatus or, alternatively, an electron cyclotron resonance (ECR) plasma reactor to replicate the mask pattern in the upper portion 34a and thereby create the via opening 35 in the layer 34a. The resist 31 serves as a etch barrier during etching, and the insulating layer 34a is etched completely through it thickness to the underlying conductive line 36, which serves as an etch stop. The use of a positive resist is not critical and a negative resist can be used, with the mask pattern being reversed. In preparation for the next step of the present invention, the resist 31 is removed from the surface 33 of the insulating layer 34a by a conventional technique such as ashing in an oxygen ($O_2$) as shown in FIG. 3d.

In accordance with embodiment of the present invention as shown in FIGS. 3e, 3f, 3g, 3h, 3l, 3m and 3n, an easily etched commercially available spin on glass (SOG) 40, which can be a silicate, doped silicate, such as phosphosilicate, borosilicate, borophophsilicate, a sioxane with 1–15% S—C bonds or a silsequioxane with one S—C bond per silicon, mixed in solvent, such as alcohol is applied to the surface 33 of the insulating layer 34a. Preferably, the SOG is a siloxane, herein a methyl siloxane which is spin coated on the surface 33 using a commercial coater. The thickness of the SOG 40 is such to overfill the via opening 35 so that after curing, it will be at least at the level of surface 33. Normally, the SOG is cured by baking first at a low temperature, 150°–250° C. for 1–15 minutes in air, followed by a higher temperature, 400°–425° C. for 30 to 60 minutes. Herein, to make the sacrificial SOG easier to subsequently remove, it is only partially cured by using only the first baking. Alternatively, a polyimide can be used as the sacrificial fill for the via opening 35 but it will require an different etchant gas, such as oxygen ($O_2$) plasma containing oxygen ions, from the etchant required for etching herein $SiO_2$.

After the via opening 35 has been filled, a second insulating layer 34b is deposited on the surface 33 of the insulating layer 34a and herein the layer 34b is $SiO_2$, using tetraethylorthosilicate (TEOS) as the silicon source in a parallel plate plasma reactor. The deposition continues until the layer 34b is about the same thickness of layer 34a or about 0.8 to 1.0 microns. Other usable insulating materials for the second insulating layer 34b are those described for the first insulating layer 34a and can be the same or different from the material used for layer 34a. A layer of commercial positive resist 41 is applied to the insulating layer 34b as shown in FIG. 3h and, after being exposed and developed, contains a conductive line opening pattern 42, as shown in FIGS. 3l and 3m. The pattern 42 is etched in the insulating layer 34b to the surface 33 of the insulating layer 34a to form a conductive line opening 43 and, in accordance with the present invention, the sacrificial fill 40, herein methyl siloxane, is quickly removed from the via opening 35 with only slight etching into the surface 33 of the insulating layer 34a. Since both the insulating layer 34b and the methyl siloxane are etchable by the same etchant gas(es), carbon tetrefluoride ($CF_4$) is herein used as the etchant in the plasma of a commercially available parallel plate reactive ion (RIE) reactor or, alternatively, an electron cyclotron resonance (ECR) plasma reactor. Once the conductive line opening 43 is formed, the resist layer 41 is removed by ashing in an $O_2$ plasma as shown in FIG. 3q. Next, the conductive line opening 43 and the via opening 35 are filled, as shown in FIG. 3r, with a conductive material 44, herein aluminum doped with 1% copper (Al/1% Cu) by sputter deposition in commercial available sputter equipment. As shown in FIG. 3s, the excess conductive material 44 is removed from the surface of the insulating layer 34b by sputter etching in commercial available equipment and the surface is planarized by preferably chem/mech polishing with commercially available equipment and slurry.

In accordance with another embodiment of the present invention, reference is made to FIGS. 3i, 3j, 3k, 3l, 3o and 3p. Starting with insulating layer 34a containing the via opening 35 of FIG. 3d, a nonconformal coating 50 of insulating material, herein SiO$_2$ using silane (SiH$_4$) as the silicon containing source, is deposited on the surface 33 of the insulating layer 34a with an initial step coverage of less than 50% so that only a thin layer forms on the sidewalls 51a and 51b and bottom 52 of the via opening 35 and thick shoulders 53a and 53b form at the edges of via opening. With continued deposition in this nonconformal manner with a step coverage of not greater than 10 to 20%, the shoulders 53a and 53b finally bridge over and create a void 54 in the via opening. The sacrificial material in this embodiment is the insulating material 50 on the walls 51a and 51b and on the bottom 52 surrounding the void 54. The deposition of the nonconformal material continues until the layer 50 herein is about the same thickness of layer 34a or about 0.8 to 1.0 microns.

As a specific example of the operating conditions for depositing the SiO$_2$ nonconformal layer 50, SiH$_4$ and nitrous oxide (N$_2$O) and nitrogen gas (N$_2$) are used in a commercially available multi-station parallel plate reactor. The SiH$_4$ flow rate is set at 200 sccm and the N$_2$O/N$_2$ flow rates are set to 6000 sccm and 3150 sccm, respectively. The chamber pressure is 2.2 Torr and the wafer temperature is held at 400° C. A 1000 watts (W) of rf power at 13.5 MHz is applied to multiple top electrodes/gas showerheads. The power density is approximately 0.5 W/cm$^2$. Under these conditions, a SiO$_2$ deposition rate of 4500 Å/min is achieved.

A layer of commercial positive resist 41 is applied to the insulating layer 50 as shown in FIG. 3k and, after being exposed and developed, contains a conductive line opening pattern 42, as shown in FIGS. 3l and 3o. The pattern 42 is etched in the insulating layer 34b to the surface 33 of the insulating layer 34a to form a conductive line opening 43 and, in accordance with the present invention, the sacrificial fill, herein the conformal material 50 on the sidewalls 51a and 51b and the bottom 52 surrounding void 54, is quickly removed from the via opening 35 with essentially no etching into the surface 33 of the insulating layer 34a. Since both the insulating layer 34b and the and the conformal insulating material 50 are etchable by the same etchant gas(es), carbon tetrafluoride (CF$_4$) is herein used in the plasma of a commercially available parallel plate reactive ion (RIE) reactor or, alternatively, an electron cyclotron resonance (ECR) plasma reactor. Once the conductive line opening 43 is formed, the resist layer 41 is removed by ashing in an O$_2$ plasma as shown in FIG. 3q. Next, the conductive line opening 43 and the via opening 35 are filled, as shown in FIG. 3r, with a conductive material 44, herein aluminum doped with 1% copper (Al/1% Cu) by sputter deposition in commercial available sputter equipment. As shown in FIG. 3s, the excess conductive material 44 is removed from the surface of the insulating layer 34b by sputter etching in commercial available equipment and the surface is planarized by preferably chem/mech polishing with commercially available equipment and slurry.

Although this invention has been described relative to specific insulating materials, conductive materials and apparatuses for depositing and removing materials, it is not limited to such materials and other materials and apparatuses for depositing and removing insulating and conductive materials can be substituted as is well understood by those skilled in the microelectronics and multilayer interconnection arts after appreciating the present invention. Further, although the embodiments of the present invention is directed to dual damascene on semiconductor devices, it also will be recognized by those skilled in multilayer interconnection substrates arts that the present invention can be used in fabricating those substrates to interconnect one or more semiconductor devices (chips) in a higher level electronic system.

We claim:

1. A method of fabricating interconnecting conductive lines and conductive vias in a layer of insulating material comprising the steps of:

forming a via opening in a first insulating layer of a thickness of the desired via height;

depositing a sacrificial material in said via opening;

forming adjacent said first insulating layer a second insulating layer of a thickness of the desired conductive line thickness layer;

forming a conductive line opening in said second insulating layer aligned with said via opening;

removing said sacrificial material from said via opening; and filling said conductive line opening and via opening with a conductive material.

2. The method of claim 1 wherein the conductive line opening is formed in said second insulating layer and said sacrificial material is removed by plasma etching with an etchant having greater selectivity for the sacrifical material than for the second insulating layer.

3. The method of claim 1 wherein the conductive line opening is formed in said second insulating layer by plasma etching with an etchant different from the etchant for removing the sacrificial material.

4. The method of claim 1 wherein an initial portion of said second insulating layer is the deposited sacrificial material and wherein, after said via opening is formed in said first insulating layer, the second insulating layer is formed by depositing a nonconformal insulating material on said first insulating layer under step conditions such that an initial portion of the nonconformal material partially lines the via opening as deposited sacrificial material and a subsequent portion of the nonconformal material bridges over the opening to leave a void in the opening.

5. The method of claim 4 wherein the nonconformal material lining the via opening is removed with the plasma etchant used to form the conductive line opening in the second insulating layer.

6. The method of claim 4 wherein the second insulating layer is silicon oxide and the silicon source for the silicon oxide is silane.

7. In the method of fabricating an integrated circuit semiconductor device with an upper surface, in which elements of the integrated circuit are interconnected at said upper surface with at least one level of conductive lines and connecting conductive vias disposed in insulating layers, comprising the steps of:

providing a semiconductor substrate having an upper surface with in which the elements of the integrated circuit are formed;

depositing a first insulating layer with an upper and lower surface and of a thickness of a desired via height, said lower surface of the first insulating layer being adjacent the upper surface of said semiconductor substrate;

forming a plurality of via openings in said first insulating layer;

depositing an easily removable sacrificial material in said via openings;

forming a second insulating layer adjacent said first insulating layer of the desired thickness of a conductive line;

forming a plurality of conductive line openings in said second insulating layer said conductive line openings being aligned with at least one via opening;

removing said sacrificial material from said via openings; and filling said conductive line opening and said via openings with a conductive material, whereby at least a number of elements of the integrated circuit are interconnected through the vias and the conductive lines.

8. The method of claim 7 wherein the conductive line openings are formed in said second insulating layer and said sacrificial material in the via openings is removed by plasma etching with an etchant having greater selectivity for the sacrificial material than for the second insulating layer.

9. The method of claim 2 or 8 wherein said second insulting layer is a silicon oxide and said sacrificial material is spin on glass and said plasma etchant contains fluorine ions.

10. The method of claim 9 wherein said spin on glass is a siloxane.

11. The method of claim 10 wherein said second insulating layer is a silicon oxide and is etched with a plasma etchant containing fluorine ions and said sacrificial material is a polyimide and is etched with a plasma etchant containing oxygen ions.

12. The method of claim 7 wherein the conductive line openings are formed in said insulating layer by plasma etching with an etchant different from the etchant for removing the sacrificial material.

13. The method of claim 12 wherein said second insulating layer is a silicon oxide and is plasma etched with an etchant containing fluorine ions and said sacrificial material is polyimide and is plasma etched with an etchant containing oxygen ions.

14. The method of claim 7 wherein an initial portion of said second insulating layer is the deposited sacrificial material and wherein, after said via openings are formed in said first insulating layer, the second insulating layer is formed by depositing a nonconformal insulating material on said first insulating layer under step conditions such that an initial portion of the nonconformal material partially lines each of the via openings as deposited sacrificial material and a subsequent portion of the nonconformal material bridges over the opening to leave a void in the opening.

15. The method of claim 14 wherein the nonconformal material lining the via opening is removed with the plasma etchant used to form the conductive line openings in the second insulating layer.

16. The method of claim 14 wherein the second insulating layer is silicon oxide and the silicon source for the silicon oxide is silane.

* * * * *